United States Patent [19]

Liu et al.

[11] Patent Number: 5,250,908
[45] Date of Patent: Oct. 5, 1993

[54] PORTABLE APPARATUS FOR TESTING MULTI-WIRE HARNESSES AND ELECTRICAL ASSEMBLIES TO IDENTIFY WIRING ERRORS

[75] Inventors: Liemeng Liu, Glendale; Gerald L. Smith, Torrance, both of Calif.

[73] Assignee: Magl Power & Electronics, Inc., Compton, Calif.

[21] Appl. No.: 807,091

[22] Filed: Dec. 13, 1991

[51] Int. Cl.⁵ .................. G10R 31/02; G08B 21/00
[52] U.S. Cl. .................. 324/542; 324/158 F; 324/537; 324/539; 340/635
[58] Field of Search .......... 324/539, 542, 66, 503, 324/537, 555, 556, 158 F, 158 P, 158 R; 390/635

[56] References Cited

U.S. PATENT DOCUMENTS

| | | | |
|---|---|---|---|
| 4,620,282 | 10/1986 | Shelley | 324/66 |
| 5,029,274 | 7/1991 | Goff et al. | 324/542 |
| 5,095,276 | 3/1992 | Nepil | 324/66 |

FOREIGN PATENT DOCUMENTS

| | | | |
|---|---|---|---|
| 8908850 | 9/1989 | PCT Int'l Appl. | 324/539 |
| 2234598A | 2/1991 | United Kingdom | 324/539 |

OTHER PUBLICATIONS

IBM Technical Disclosure Bulletin vol. 13 No. 11 Apr. 1971 324(539) Malin.

*Primary Examiner*—Gerard R. Strecker
*Assistant Examiner*—Diep Do
*Attorney, Agent, or Firm*—Monty Koslover Associates

[57] ABSTRACT

A device for testing multi-wire harnesses, printed wiring board assemblies and card cages for wiring faults. The device comprises power and logic circuits in a housing, a fault indicator panel, a resistance balance circuit and a low voltage wiring test array. The wire harness is connected with both ends of the wires to sets of terminals on the wiring test array. In testing a wire harness, the operator grasps two probes which are attached to the resistance balance circuit and wipes them on the terminals of the test array. For test of printed wiring board assemblies or card cages, only one probe is required to contact the terminals on the test array. This action causes the resistance balance circuit to combine with the wiring test array segment and a wiring harness wire to form a voltage divider circuit which outputs voltage signals related to the wiring status. The device logic processes these signals and causes any fault indication to illuminate on the indicator panel. The device is light, and portable and offers the advantages of low cost, ease of use, safety and simplicity.

12 Claims, 3 Drawing Sheets

PORTABLE APPARATUS FOR TESTING MULTI-WIRE HARNESSES AND ELECTRICAL ASSEMBLIES TO IDENTIFY WIRING ERRORS

BACKGROUND AND OBJECTS OF THE INVENTION

This invention relates to devices for the testing of wiring for continuity, open, short circuit or mis-wire.

The type of wiring towards which this invention is specifically directed, is wiring harnesses such as are made up for most electrical equipments. Printed Wiring Board assemblies (PWBA's) and Card Cages may also be tested by the invention.

Wiring analysis and testing devices have been known and available for a good many years. These devices range from those analyzers designed for cable testing such as U.S. Pat. No. 2,810,881, Automatic Cable Tester by W. E. Daily, to those designed for identifying matching wires, as described by U.S. Pat. No. 4,114,091, to J. L. Howard. Other devices, including U.S. Pat. No. 4,929,902 to W. A. Nelson, are specially directed to the test of coaxial cables and can not easily be adapted for wiring harnesses. In the typical factory, wiring harnesses are tested using very complex equipment. A single wiring harness under test may easily have more than fifty separate wires in a bundle. In order to handle this amount of wires, the presently available analyzer would need the same number of test circuits as wires under test. As a result, the analyzer is usually large and heavy, requiring that the harness be brought to it rather than moving the analyzer to the harness. The analyzer equipment is also expensive, in the order of tens of thousands of dollars because of its complexity.

There appear to be no wiring analyzers, whether patented and/or marketed, which are simple, light weight and inexpensive while being suitable for use in the test of multi-wire harnesses having large numbers of wires. It is thus an objective of the present invention to provide a wiring analyzer suitable for test of multi-wire harnesses, which is inexpensive, manually operated, portable and capable of being easily moved to various test locations.

Another object of the present invention is the provision of a wiring analyzer that is easy to operate and incorporates display indications of wiring faults.

Yet another object is the provision of a test circuit which may be used to test Printed Wiring Board assemblies and Card Cages for short circuits.

Other objects and advantages of the present invention will become apparent from a study of the following detailed description, the claims and the drawings illustrating the preferred embodiment.

DETAILED DESCRIPTION OF THE PREFERRED EMBODIMENT

Figure 1:
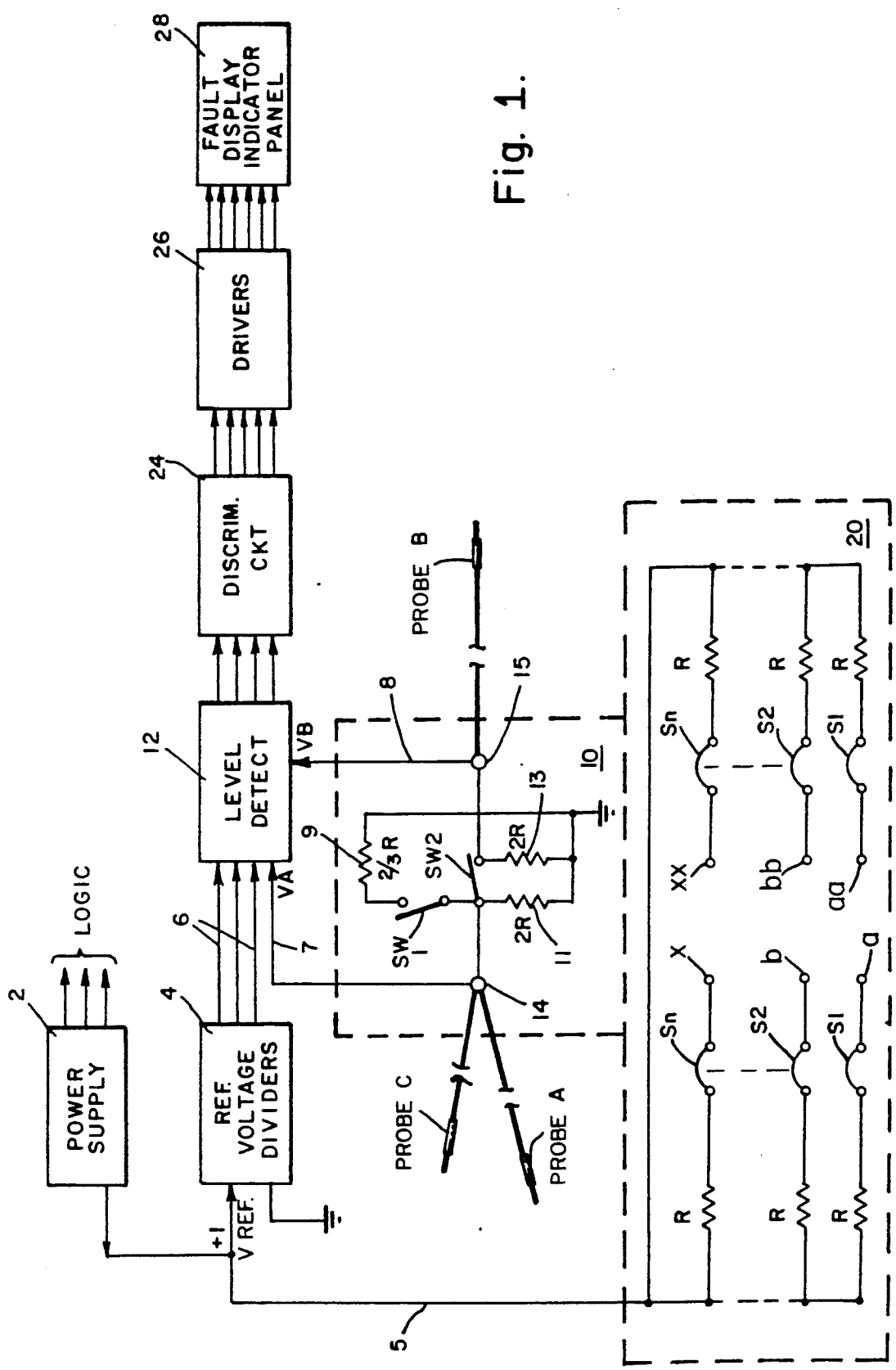
FIG. 1 is a block diagram/schematic illustrating the preferred embodiment of the present invention.

Referring now to the drawings, there is shown in FIG. 1 a block diagram and schematic of the preferred embodiment of the wiring analyzer device of this invention. The device comprises a power supply means 2, logic and display circuit means 4,12,24,26, a resistance balance circuit 10, a wiring test array 20, a fault display indicator panel 28, three probes A,B and C, and a housing for the circuits. The housing and the display indicator panel are not physically illustrated and may be any convenient shape and size.

The wiring analyzer device can be used in two modes of operation. These are 1) for testing multi-wire harnesses or single wire bundles, and 2) for testing PWBA's, Card Cages (which hold PWBA's) and similar electrical circuits having brought out terminals. In the first mode, it is necessary to set switch SW 1 in the resistance balance circuit 10, to be closed and switch SW 2 to be open, prior to test. The multi-wire harnesses are then connected, both ends of each wire to wiring test array 20 terminals a,b through x at one end and to array 20 terminals aa, bb, through xx at the other end. The number of available array terminals is arbitrary and can be made to be fifty or more as desired. Testing is performed by the operator grasping two probes, A and B, and contacting them at the same time in sliding engagement on the wiring test array terminal pins in sequence. The status of the wiring, when the probes are on a given set of terminal pins, will be indicated on the fault display and indicator panel 28.

In the second mode of operation, as used for testing PWBA's, Card Cages and the like, switch SW 1 in the resistance balance circuit 10 must be set open and switch SW 2 set closed prior to start of test. The PWBA or Card Cage is then connected to one set of terminals only, e.g. terminals a,b through x on the wiring test array 20. Testing is performed by the operator grasping one of the probes, A or C, and wiping it on the wiring test array 20 terminal pins in sequence. The status of the wiring on which the probe rests, will be indicated at the time on the fault display and indicator panel 28.

During a test of a wiring harness, If a wiring fault is detected on any wire, the fault display indicator panel will illuminate an "OPEN", a "SHORT CIRCUIT" or a "MIS-WIRE", depending on what is detected. A normal connection will show no illumination. Thus, a fault illumination when the probes are on a given set of pins, locates the wire having the fault as well as its type. In general, it is also recommended that the probes be reversed for at least one pass, with probe A on terminal aa and probe B on terminal a for example. This is because a mis-wire (a cross-wire from one pin connector to the wrong opposite pin connector) combined with an open circuit on the adjacent wire, may not indicate a fault when the probes wipe the terminals in the standard configuration. The reverse configuration however, will detect such a miswire/open combination and will indicate it.

Referring once more to FIG. 1, it is seen that the wiring test array 20 comprises a multiplicity of paralleled resistive branches, arranged in pairs, with terminals for the connection of multi-wire harnesses, or PWBA terminals thereto. These terminals are designated a, and b through x for one set of wire ends, and terminals aa, bb through xx for the opposite set of wire end connectors.

Each half of a pair of resistive branches is connected to a +1 volt dc reference bus 5 on one end, and a wire terminal at the other end, and comprises a fixed resistor R connected in series with a switch S1, S2 or Sn. Thus, for example, if a wire was connected between terminals a and aa, a single circuit would be created of two fixed resistors of R ohms, and two switches S1 in series with the wire under test. The switches S1, S2 through Sn are normally closed and are included in each resistive branch for the purpose of disconnecting the branch if needed.

The value R of the fixed resistors is identical for each branch, and in this embodiment, is selected as 20 ohms. This is a suitably low value. However, they can be selected to be any convenient low resistance.

Figure 3:
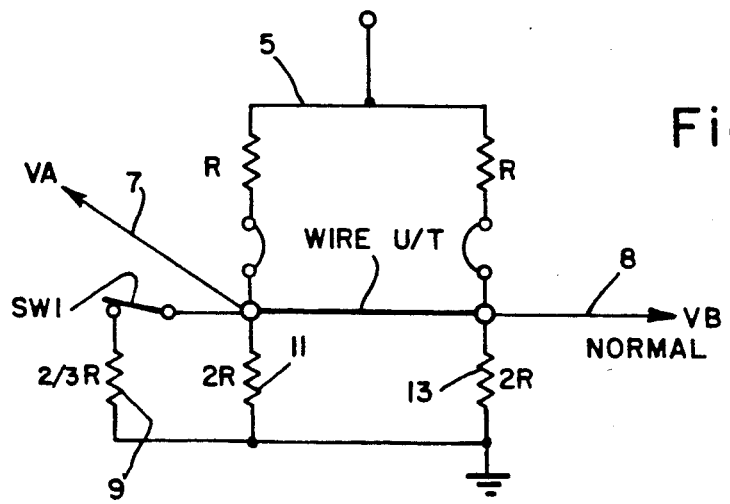
FIGS. 3, 4 and 5 are schematics of the test circuitry showing different examples of wires under test.
Figure 4:
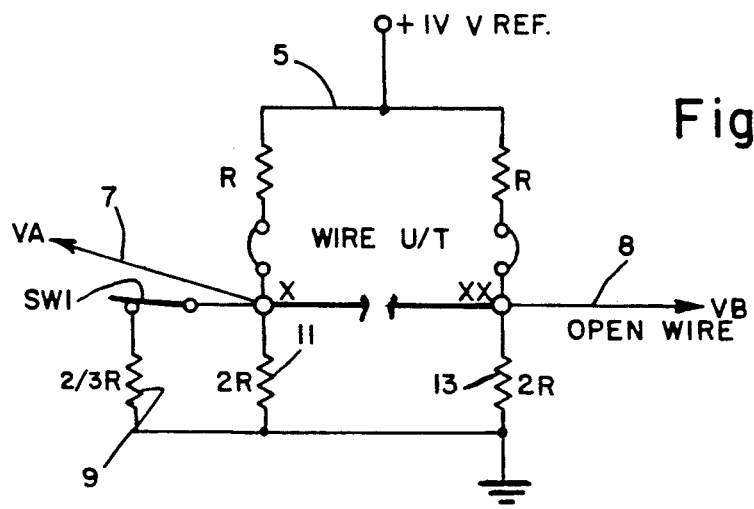
Figure 5:
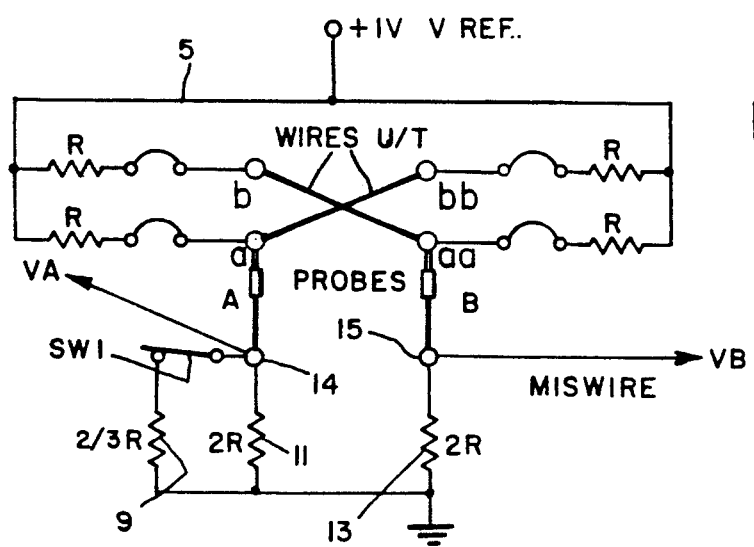

The basis of this invention rests primarily on the combination of the resistance balance circuit 10, and one or more pairs of array 20 branch circuits to form voltage divider circuits when probes A and B are touched on the array terminals across the wire(s) under test. These voltage divider circuits, as illustrated by FIGS. 3, 4 and 5, have output voltages $V_A$ and $V_B$ which are a function of the ratios of the balance circuit 10 resistance values to the wiring test array 20 plus test wire resistances. Thus, the relative values of the fixed resistances R in the array 20 and the resistance balance circuit 10 must be as described herein if the analyzer is to operate effectively.

Probes A and C which are alternate probes having the same function, are each connected 14 to the terminal of the first resistor 11 in the resistance balance circuit 10. connected 14 to the same point as probe A. Probe B is connected 15 to the terminal of the third resistor 13 in the resistance balance circuit 10. The probes are connected by long leads so as to facilitate the operator grasping them and contacting the probes on the test array terminals during test.

Referring again to FIG. 1, it is seen that the resistance balance circuit 10 comprises a network of first 11, second 9 and third 19 resistors connected in parallel to ground. A first switch SW 1 and a second switch SW 2, connected between the resistor terminals, are provided to permit changing the balance circuit configuration to match the wiring test array configuration under test, whether testing a mult-wire harness or a PWBA. Switch SW 1 connects the terminals of the first and second resistor when closed, and switch SW 2 connects the terminals of the first and third resistor, when closed. For testing multi-wire harnesses, switch SW 1 is maintained normally closed and switch SW 2 is open. For testing PWBA's or Card Cages, the opposite configuration obtains: switch SW 1 is normally open and switch SW 2 is closed.

The first resistor 11 has a resistance value of 2 times R ohms, which is to say that it is ratioed to the value of the fixed resistor R in the wiring test array 20. In this embodiment the first resistor value would be 2*20 ohms=40 ohms. The second resistor 9 has a resistance value of ⅔ times R ohms, and the third resistor has a value of 2 times R ohms.

When the resistance balance circuit is energized, it will have an output of $V_A$ volts at the terminal 14 of the first resistor 11, and an output of $V_B$ volts at the terminal 15 of the third resistor 13. Two lines 7, 8 for outputs $V_A$ and $V_B$, are therefore provided to connect the terminals 14, 15 with the level detect circuit 12 of the logic and display circuit means.

Any of the switches S1 through Sn in the test array 20, which are normally closed, may be opened during a test. For programming a given cable harness where short circuits are normal, the opening of certain switches S1 through Sn will prevent erroneous fault indications.

Having described the measuring circuits, the balance circuit 10 output voltage signals $V_A$ and $V_B$, relating to the wiring condition, are connected input to the level detect 12 logic circuit for processing and indication. The power, logic and display circuits comprise a power supply means 2 and logic and display circuit means.

The power supply means 2 includes a simple conventional solid state dc supply, which accepts input 115 Vac, 50 or 60 Hz power and outputs a regulated +1 Vdc plus various dc voltages for the logic and indicator driver support. Alternatively, a battery source plus a dc regulator may be used as the power supply means where access to AC input power is limited.

The logic and display circuit means comprises a reference voltage divider circuit 4, a level detector circuit 12, a discriminator circuit 24 and a driver circuit 26.

A +1 Vdc is connected to the wiring test array bus 5 and also input as $V_{REF}$ to the voltage divider circuit 4. The voltage divider circuit 4 is constructed in a conventional, well established manner and takes the +1 Vdc input, producing three reference voltage outputs: +0.702 Vdc, +0.516 Vdc and +0.397 Vdc. These reference voltages are transmitted by wire 6 to the level detector circuit 12.

Figure 2:
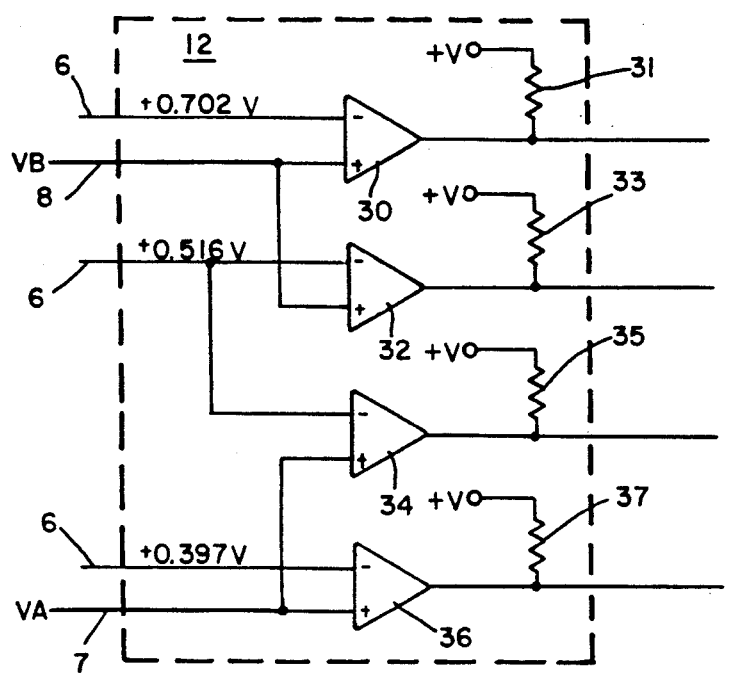
FIG. 2 is a simplified schematic of the Level Detect circuit which is part of the logic used in the present invention.

FIG. 2 is a simplified schematic of the level detector circuit. Four comparator channels 30, 32, 34, and 36 are used to examine the signal values $V_A$ and $V_B$ which are input from the resistance balance circuit 10 and probes A and B.

An input signal $V_B$ is connected 8 to the positive terminals of the first comparator 30 and the second comparator 32, while signal $V_A$ is connected 7 to the positive terminals of the third comparator 34 and the fourth comparator 36.

Reference voltage 0.516 V is connected 6 to the negative terminals of the second comparator 32 and third comparator 34, while reference voltage 0.702 V is connected only to the negative terminal of the first comparator 30. Reference voltage 0.397 V is connected to the negative of the fourth comparator 36.

The output circuit of each comparator includes a pullup resistor 31, 33, 35, 37 connected to it to provide a voltage swing in the range of 5 to 10 volts to ground.

In the level detect circuit, signals $V_A$ and $V_B$ are compared to the reference voltages and an output signal, high or low, is produced by each comparator depending on whether the $V_A$, $V_B$ signals are higher or lower in value than the reference voltages. These comparator outputs are connected input to the discriminator logic 24 whihc is comprised of gates. The discriminator logic gates are designed and arranged to look at the comparator output signals and to discriminate the particular level states as indicative of the measured wire condition.

The discriminator output selection versus the input $V_A$ and $V_B$ voltage signals is given in the following Table 1 for a reference bus voltage VREF of +1 VDC.

TABLE 1

| $V_A$ | $V_B$ | Discriminator Output |
|---|---|---|
| 0.444 | 0.444 | Normal |

TABLE 1-continued

| $V_A$ | $V_B$ | Discriminator Output |
|---|---|---|
| 0.50 | 0.80 | Mis-wire |
| 0.615 | 0.615 | Short Circuit |
| 0.333 | 0.667 | Open Circuit |
| 0.333 | 0.80 | Mis-wire and Open |
| 0.60 | 0.667 | Mis-wire and Short |

Under certain circumstances, more than one state may be detected at the same time. For example, a mis-wire crossing with an open, would detect both the open and the mis-wire. This is shown in Table 1 above.

The discriminator logic 24 output activates certain drivers 26 which, in turn, illuminate the appropriate indicator on the display indicator panel 28. The indicators will indicate an 'OPEN', a 'SHORT' or a 'MIS-WIRE'. When no wiring error is detected, the wiring is considered to be normal and no indicators are illuminated.

Referring now to FIGS. 3, 4 and 5, there are shown representations of the equivalent divider circuits formed for three different wiring test conditions: normal, open and a mis-wire. In FIGS. 3 and 4, probes A and B are not shown but they effectively connect the lower portion of the circuit (which is the balance resistance portion 10) to the upper at terminals x, xx, when the probes touch the terminals.

In FIG. 3, the wire under test (U/T) is continuous and without errors. In this case, applying a reference voltage of +1 V at the test array bus 5 to the voltage divider circuit results in a voltage of 0.444 V at terminals x and xx. Therefore, $V_A$ 7 and $V_B$ 8 will both have a voltage of 0.444 V input to the logic circuits, producing a 'normal' designation outcome.

In FIG. 4, the wire under test is open. Applying the reference voltage of +1 V at the array bus 5, results in a voltage of 0.333 V at terminal x and 0.667 V at terminal xx. Thus, $V_A$ 7 will have a voltage of 0.333 V and $V_B$ 8 will have a voltage of 0.667 V. These voltages are input to the logic circuits, producing a detection of an open circuit and illumination of the 'OPEN' indicator for the wire connected between terminals x and xx.

In FIG. 5, an example of crossed wires is illustrated. The wires are shown crossed to adjacent terminals, but could just as easily have been crossed to some other terminals. The analyzer detection will be the same, irrespective of which terminals are connected. When probe A is touched to terminal a and probe B to terminal aa, the measured voltages will be 0.50 V at terminal a for $V_A$ and 0.80 V at terminal aa for $V_B$. The same voltages would be measured if probes A and B were moved to touch terminals b and bb instead. These $V_A$ and $V_B$ measurements, when input to the logic circuits, produce a 'MIS-WIRE' indication illumination. In order to determine the location of the crossed wire terminal on the opposite sides, it is necessary to move the probes up the terminals in sliding action, until another 'MIS-WIRE' reading is obtained, indicating the location of the crossed terminal. The wiring error can then be corrected.

Figure 6:
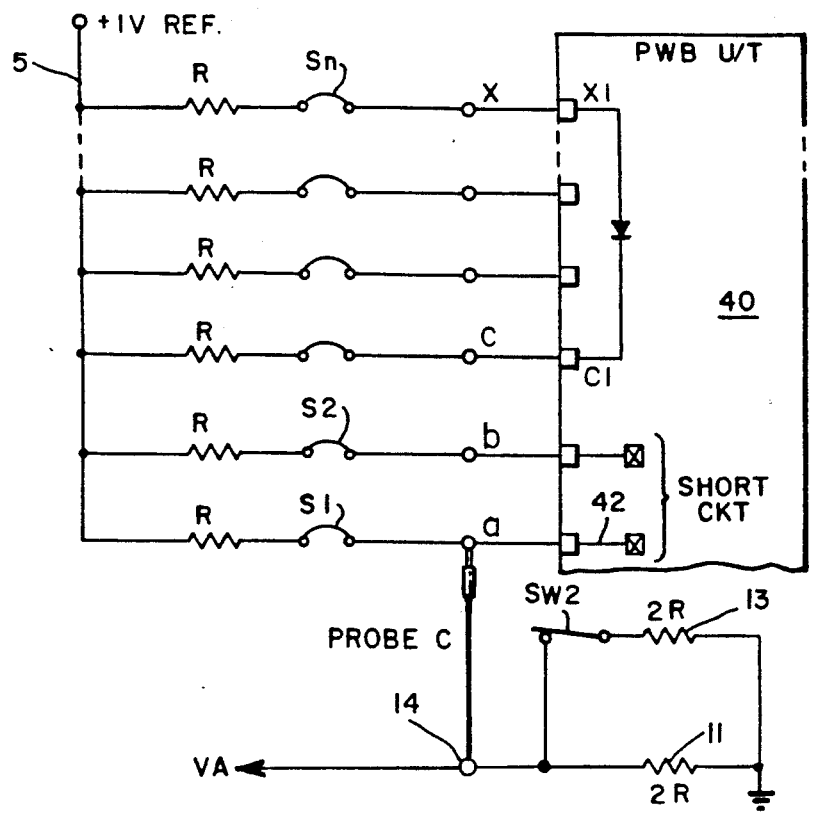
FIG. 6 is a schematic of the test circuitry of the present invention, being applied to test of a Printed Wiring Board assembly (PWBA).

In addition to analyzing multi-wire harnesses and cables, the analyzer can be used to scan individual pins on a Printed Wiring Board (PWB) assembly or a Card Cage assembly for wiring shorts. FIG. 6 illustrates the use of the analyzer to detect wiring errors in a PWB 40. For this mode of operation, switch SW1 is opened and switch SW2 is closed, creating a different balance circuit composed only of the two paralleled first 11 and third 13 resistors. Only one probe, designated probe C, is used to scan and touch the array terminals a, b, c through x which are connected to PWB pins, and only one side of the wiring test array 20 is needed.

In the partial illustration of the PWB 40, pins x1 and c1 are shown connected by a diode 44 while another two pins, are connected by a short circuit 42. Terminals a and b of the test array are shown connected to the shorted pins.

With a +1 V reference voltage applied to the array bus 5, and probe C is touched to terminal a, the voltage at a and on the balance circuit connection will be 0.667 V. This voltage on $V_A$ and on $V_B$ when input to the logic circuitry will result in a 'SHORT CIRCUIT' indication on the display panel. The same result will occur when the probe is placed on terminal b which is also attached to a shorted pin.

However, when the probe is touched to terminal c or x, a short circuit will not be indicated although the PWB pins x1 and C1 are tied by a diode 44. This is desirable because many PWB's incorporate pins connected by a diode and this is not a wiring error.

If a wiring jumper or loop had been placed between the two PWB pins X1 and C1, a probe scan of terminal c or x would have analyzed it as being an internal short circuit. To combat this occurrence, the opening of switch Sn, which connects resistor Rn to terminal x and to pin x1 will cause the analyzer to produce a 'normal' reading of 0.5 V since the loop return path is now opened.

This analyzer is uniquely adapted to scan for short circuits in PWB assemblies because the low reference voltage and current is such that sensitive semiconductors will not be damaged. Further, if a semiconductor connecting to a pin is short circuited, the analyzer will detect it.

Finally, the attributes of this invention may be summarized as follows:

1. Only a low power supply—3 to 5 ma versus 6 amperes for conventional analyzers—need be used to power the analyzer. A battery source may be used.

2. All the logic and driver/display circuitry, including the balance resistance circuitry 10, can be put on a small board, occupying little space.

3. The wiring test array 20 can be placed on a convenient sized backing board and expanded to any desirable number of test circuits.

4. The electronic components required are relatively few in number and do not require characteristics leading to high component cost. Circuit reliability is also higher than for available complex wiring analyzers because of the smaller number and simpler components used by this invention.

5. The analyzer is simple to use and requires little instruction as a preparation.

6. The electronic, power and display circuits can be packaged in a small, light weight box, making the analyzer portable and capable of being easily moved to any needed location.

7. Because of its simplicity, for a 100 wire multi-wire analyzer, the invention device represents a 15:1 cost ratio improvement over current available multi-wire analyzers.

8. The analyzer can also be used to scan PWB's for short circuits because of its low applied voltage and current, avoiding possible damage to the PWB.

9. The analyzer can also be used to scan Card Cages for opens, shorts and mis-wires.

Alternative embodiments and various modifications of the depicted embodiments will be apparent from the above description to those skilled in the art. These alternatives and modifications are considered to be equivalent and within the scope and spirit of the present invention.

Having described the invention, what is claimed is:

1. A portable wiring analyzer device for multi-wire harnesses, comprising in combination:
   (a) a power supply means; said power supply means supplying a +1 Volt dc reference output and regulated dc voltages for operating said device;
   (b) a wiring test array, connected to said +1 Volt dc reference output and having a multiplicity of paralleled resistive branches arranged in pairs with terminals for the connection of said multi-wire harnesses thereto; said each resistive branch pair including a fixed resistor having a resistance value of R ohms;
   (c) a resistance balance circuit comprising a network of first, second and third resistors connected in parallel to ground, and a first switch and a second switch; said resistors having values of resistance ratioed to the value of said wiring test array fixed resistors as follows: said first resistor value=2 times R ohms, said second resistor value=$\frac{2}{3}$ times R ohms and said third resistor value=2 times R ohms; said first switch connecting the terminal of said first resistor to the terminal of said second resistor, and being normally closed; said second switch connecting the terminal of said first resistor to the terminal of said third resistor, and being normally open; said first and second switch status producing a balance circuit configuration to match with said wiring test array and suitable for testing multi-wire harnesses;
   said first resistor having a signal line connected to its terminal for output of voltage signal $V_A$; said third resistor having a signal line connected to its terminal for output of voltage signal $V_B$; said voltage signals $V_A$ and $V_B$ being generated when said resistance balance circuit is activated;
   (d) logic and display circuit means, having said voltage signals $V_A$ and $V_B$ connected input to it and producing output signals indicative of the status of wiring faults in said multi-wire harness under test;
   (e) a fault display indicator panel; said panel receiving signals for wiring fault indication from said logic and display circuits means, and displaying indication of any detected faults in said multi-wire harness;
   (f) a first probe designated probe A, a second probe designated probe B and a third probe designated probe C;
   said probe A and probe C being connected as alternates to said first resistor terminal in said resistance balance circuit for output of said voltage signal $V_A$, and said probe B being connected to said third resistor terminal in said resistance balance circuit for output of said voltage signal $V_B$; said resistance balance circuit being activated by an operator grasping said probe A and probe B, one in each hand, and contacting each said probe in sliding engagement with the wire harness terminals on said wiring test array, causing said resistance balance circuit to be connected in a voltage divider configuration to said wiring test array as each set of harness terminals is contacted, and outputting said voltage signals $V_A$ and $V_B$ to said logic and display means and said indicator panel which indicates the status of said wire harness faults.

2. A device as in claim 1 wherein said power supply means includes a battery and voltage regulator having a +1 Volt dc regulated output and regulated dc output voltages for operating said device.

3. A device as in claim 1 wherein each said resistive branch in said wiring test array includes a normally closed switch connected in series for the purpose of disconnecting said branch from the wire under test.

4. A device as in claim 1 wherein said fixed resistor in each said resistive branch in said wiring test array has a resistance value R of 20 ohms.

5. A device as in claim 1 wherein said logic and display circuit means comprises a reference voltage divider circuit, a level detector circuit, a discriminator circuit and an indicator driver circuit;
   said reference voltage divider circuit having a +1 Volt signal input and being adapted to produce three reference voltages: +0.702 vdc, +0.516 vdc and +0.397 vdc for input to said level detector circuit;
   said level detector circuit having said three reference voltages and said voltage signals $V_A$ and $V_B$ connected input to it and producing a set of high and low signals depending on the input value of signals $V_A$ and $V_B$ for input to said discriminator circuit;
   said discriminator circuit comprising logic gates arranged to look at said set of high and low signals from said level detector and to discriminate the signals corresponding to a particular wiring fault level state, said discriminator circuit providing a wiring fault level state signal to said indicator driver circuit;
   said indicator driver circuit comprising drivers which are activated by a input wiring fault level signal to illuminate the appropriate signal on said fault display indicator panel.

6. A device as in claim 5 wherein said level detector circuit comprises four comparator channels; a first channel comprising a reference voltage 0.702 V signal connected to the negative terminal of a first comparator and input signal $V_B$ connected to the positive terminal of said first comparator with said first comparator having a first pullup resistor connected to its output, said pullup resistor being supplied with a low dc voltage in the range of 5 to 10 volts to provide for a comparator output voltage swing to ground;
   a second channel comprising a reference voltage of 0.516 V connected to the negative terminal of a second comparator and input signal $V_B$ connected to the positive terminal of said second comparator; said second comparator having a second pullup resistor connected to its output, said pullup resistor being supplied with a low dc voltage in the range of 5 to 10 volts to provide for a comparator output voltage swing to ground;
   a third channel comprising a reference voltage of 0.516 V connected to the negative terminal of a third comparator and input signal $V_A$ connected to the positive terminal of said third comparator; said third comparator having a third pullup resistor connected to its output, said pullup resistor being supplied with a low dc voltage in the range of 5 to 10 volts to provide for a comparator output voltage swing to ground;

a fourth channel comprising a reference voltage of 0.397 V connected to the negative terminal of a fourth comparator and input signal VA connected to the positive terminal of said fourth comparator; said fourth comparator having a fourth pullup resistor connected to its output, said pullup resistor being supplied with a low dc voltage in the range of 5 to 10 volts to provide for a comparator output voltage swing to ground.

7. A portable wiring analyzer device for Printed Wiring Board Assemblies (PWBA) and Card Cages, comprising in combination:

(a) a power supply means, said power supply means supplying a +1 Volt dc reference output and regulated dc voltages for operating said device;

(b) a wiring test array, connected to said +1 Volt dc reference output and having a multiplicity of paralleled resistive branches arranged in pairs with test terminals for the connection of said PWBA or Card Cages thereto; said each resistive branch pair including a fixed resistor having a resistance value of R ohms;

(c) a resistance balance circuit comprisinng a network of first, second and third resistors connected in parallel to ground and two switches: a first switch and a second switch; and resistors having values of resistance ratioed to the value of said wiring test array fixed resistors as follows: said first resistor value=2 times R ohms, said second resistor value=⅔ times R ohms and said third resistor value=2 times R ohms; said first switch connecting the terminal of said first resistor to the terminal of said second resistor and being normally open; said second switch connecting the terminal of said first resistor to the terminal of said third resistor, and being normally closed; said first and second switch status producing a balance circuit configuration to match with said wiring test array, resulting in a voltage divider circuit suitable for test of a PWBA or Card Cage assembly;

said first resistor having a signal line connected to its terminal for output of voltage signal $V_A$; said voltage signal $V_A$ being generated when said resistance balance circuit is activated;

(d) logic and display circuit means, having said voltage signal $V_A$ connected input to it and producing output signals indicative of the status of wiring faults in said PWBA or said Card Cage assembly;

(e) a fault display indicator panel; said panel receiving signals for wiring fault indication from said logic and display circuit means and indicating any detected faults; and (f) a first probe designated probe A and a second probe designated probe C; said first and second probes being connected as alternates, to said first resistor terminal in said resistance balance circuit for output of said voltage signal $V_A$; said resistance balance circuit being activated by an operator grasping said probe A or probe C and contacting said probe A or C in sliding engagement with the test wire terminals for said PWBA or Card Cage on said wiring test array, causing said resistance balance circuit to be connected in a voltage divider configuration to said wiring test array as each said test wire terminal is contacted, and outputting said voltage signal $V_A$ to said logic and display means and indicator panel which indicates the status of said PWBA or Card Cage faults.

8. A device as in claim 7 wherein said power supply means includes a conventional solid state dc supply which accepts input 115 Vac 50 or 60 Hz input power and outputs a regulated +1 Vdc plus additional regulated dc voltages as required for operation of said device logic.

9. A device as in claim 7 wherein each said resistive branch in said wiring test array includes a normally closed switch connected in series for the purpose of disconnecting said branch from the wire under test.

10. A device as in claim 7 wherein said fixed resistor in each said resistive branch in said wiring test array has a resistance value R of 20 ohms.

11. A device as in claim 7 wherein said logic and display circuit means comprises a reference voltage divider circuit, a level detector circuit, a discriminator circuit and an indicator driver circuit;

said reference voltage divider circuit having a +1 Volt signal input and being adapted to produce three reference voltages: +0.702 vdc, +0.516 vdc and +0.397 vdc for input to said level detector circuit;

said level detector circuit having said three reference voltages and said voltage signals $V_A$ and $V_B$ connected input to it and producing a set of high and low signals depending on the input value of signals $V_A$ and $V_B$ for input to said discriminator circuit;

said discriminator circuit comprising logic gates arranged to look at said set of high and low signals from said level detector and to discriminate the signals corresponding to a particular wiring fault level state, said discriminator circuit providing a wiring fault level state signal to said indicator driver circuit;

said indicator driver circuit comprising drivers which are activated by a input wiring fault level signal to illuminate the appropriate signal on said fault display indicator panel.

12. A device as in claim 11 wherein said level detector circuit comprises four comparator channels; a first channel comprising a reference voltage 0.702 V signal connected to the negative terminal of a first comparator and input signal $V_B$ connected to the positive terminal of said first comparator with said first comparator having a first pullup resistor connected to its output, said pullup resistor being supplied with a low dc voltage in the range of 5 to 10 volts to provide for a comparator output voltage swing to ground;

a second channel comprising a reference voltage of 0.516 V connected to the negative terminal of a second comparator and input signal $V_B$ connected to the positive terminal of said second comparator; said second comparator having a second pullup resistor connected to its output, said pullup resistor being supplied with a low dc voltage in the range of 5 to 10 volts to provide for a comparator output voltage swing to ground;

a third channel comprising a reference voltage of 0.516 V connected to the negative terminal of a third comparator and input signal VA connected to the positive terminal of said third comparator; said third comparator having a third pullup resistor connected to its output, said pullup resistor being supplied with a low dc voltage in the range of 5 to 10 volts to provide for a comparator output voltage swing to ground;

a fourth channel comprising a reference voltage of 0.397 V connected to the negative terminal of a fourth comparator and input signal VA connected to the positive terminal of said fourth comparator; said fourth comparator having a fourth pullup resistor connected to its output, said pullup resistor being supplied with a low dc voltage in the range of 5 to 10 volts to provide for a comparator output voltage swing to ground.

* * * * *